(12) United States Patent
Nulty et al.

(10) Patent No.: US 6,784,552 B2
(45) Date of Patent: *Aug. 31, 2004

(54) STRUCTURE HAVING REDUCED LATERAL SPACER EROSION

(75) Inventors: James E. Nulty, San Jose, CA (US); Christopher J. Petti, Mountain View, CA (US)

(73) Assignee: Cypress Semiconductor Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/540,610

(22) Filed: Mar. 31, 2000

(65) Prior Publication Data

US 2002/0146897 A1 Oct. 10, 2002

Related U.S. Application Data

(62) Division of application No. 08/577,751, filed on Dec. 22, 1995, now Pat. No. 6,066,555.

(51) Int. Cl.[7] .......................... H01L 23/48; H01L 23/52; H01L 29/40
(52) U.S. Cl. ....................... 257/774; 257/774; 257/775; 257/776; 438/634; 438/637; 438/639; 438/257
(58) Field of Search ................................ 257/774, 775, 257/776, 756–760, 762, 763, 765; 438/634, 637, 639, 257

(56) References Cited

U.S. PATENT DOCUMENTS

| 4,660,276 A | 4/1987 | Hsu ............................ 438/595 |
| 4,806,201 A | 2/1989 | Mitchell et al. ............ 438/595 |
| 4,956,312 A | 9/1990 | Van Laarhoven ........... 437/180 |
| 5,037,777 A | 8/1991 | Mele et al. .................... 43/639 |

(List continued on next page.)

FOREIGN PATENT DOCUMENTS

JP          11111691 A   *   4/1999

OTHER PUBLICATIONS

J. Givens et al., "Selective dry etching in a high density plasma for 0.5 μm complimentary metal–oxide–semiconductor technology," J. Vac. Sci. Technol. B 12(1), Jan./Feb. 1994, pp. 427–432.

K.K. Shih et al., "Hafnium dioxide etch–stop layer for phase–shifting masks," J. Vac. Sci. Technol. B 11(6), Nov./Dec. 1993, pp. 2130–2131.

Primary Examiner—Bradley Baumeister
Assistant Examiner—Chris C. Chu
(74) Attorney, Agent, or Firm—Evan Law Group LLC (57) ABSTRACT

A process for minimizing lateral spacer erosion of an insulating layer adjacent to a contact region and an apparatus whereby there is provided a contact opening with a small alignment tolerance relative to a gate electrode or other structure are disclosed. The process includes the steps of forming a conductive layer on a semiconductor body, then depositing an insulating layer adjacent to the conductive layer. Next, substantially rectangular insulating spacers are formed adjacent to the gate electrode. An etch stop layer is deposited adjacent the insulating layer, followed by an etch to remove the etch stop layer material from the contact region. This etch is conducted under conditions wherein the etch removes the etch stop layer, but retains the substantially rectangular lateral spacer profile of the first insulating layer. The apparatus is capable of maintaining high quality contacts between the conductive material in the contact region and an underlying device region such as a source or drain, or some other layer or structure, and is an effective structure for small feature size structures, particularly self-aligned contact structures.

12 Claims, 7 Drawing Sheets

U.S. PATENT DOCUMENTS

| | | | | |
|---|---|---|---|---|
| 5,100,838 A | | 3/1992 | Dennison | 437/195 |
| 5,166,096 A | | 11/1992 | Cote et al. | 438/595 |
| 5,234,856 A | * | 8/1993 | Gonzalez | 438/244 |
| 5,264,341 A | | 11/1993 | Maciak et al. | 435/7.21 |
| 5,275,972 A | | 1/1994 | Ogawa et al. | 43/639 |
| 5,306,657 A | * | 4/1994 | Yang | 438/278 |
| 5,306,952 A | | 4/1994 | Matsuura et al. | 257/165 |
| 5,338,700 A | * | 8/1994 | Dennison et al. | 438/253 |
| 5,364,817 A | | 11/1994 | Lur et al. | 437/190 |
| 5,366,929 A | | 11/1994 | Cleeves et al. | 437/195 |
| 5,378,646 A | | 1/1995 | Huang et al. | 438/595 |
| 5,382,483 A | | 1/1995 | Young | 430/5 |
| 5,384,281 A | | 1/1995 | Kenney et al. | 437/189 |
| 5,466,636 A | | 11/1995 | Cronin et al. | 43/639 |
| RE35,111 E | | 12/1995 | Liou et al. | 438/595 |
| 5,482,894 A | | 1/1996 | Havemann | 437/195 |
| 5,488,011 A | * | 1/1996 | Figura et al. | 438/253 |
| 5,521,121 A | | 5/1996 | Tsai et al. | 437/190 |
| 5,562,801 A | | 10/1996 | Nulty | 156/643.1 |
| 5,569,628 A | | 10/1996 | Yano et al. | 437/190 |
| 5,587,331 A | | 12/1996 | Jun | 437/190 |
| 5,756,396 A | | 5/1998 | Lee et al. | 438/622 |
| 5,759,867 A | | 6/1998 | Armacost et al. | 438/634 |
| 6,046,505 A | * | 4/2000 | Howard | 257/776 |

* cited by examiner

STRUCTURE HAVING REDUCED LATERAL SPACER EROSION

This application is a divisional of application Ser. No. 08/577,751, now U.S. Pat. No. 6,066,555, filed Dec. 22, 1995 issued on May 23, 2002.

BACKGROUND OF THE INVENTION

1. Field of the Invention

The invention relates to semiconductor device processes, and more particularly, to improved methods for etching openings in insulating layers and a seniconductor device with well defined contact openings.

2. Background of the Invention

In the fabrication of semiconductor devices, numerous conductive device regions and layers are formed in or on a semiconductor substrate. The conductive regions and layers of the device are isolated from one another by a dielectric. Examples of dielectrics include silicon dioxide, $SiO_2$, tetraethyl orthosilicate glass ("TEOS"), silicon nitrides, $Si_xN_y$, silicon oxynitrides, $SiO_xN_y(H_z)$, and silicon dioxide/silicon nitride/silicon dioxide ("ONO"). The dielectrics may be grown, or may be deposited by physical deposition (e.g., sputtering) or by a variety of chemical deposition methods and chemistries (e.g., chemical vapor deposition ("CVD")). Additionally, the dielectrics may be undoped or may be doped, for example with boron, phosphorous, or both, to form, for example, borophosphosilicate glass ("BPSG"), phosphosilicated glass ("PSG"), and borophosphosilicate tetraethyl orthosilicate glass ("BPTEOS").

At several stages of the fabrication of semiconductor devices, it is necessary to make openings in the dielectric to allow for contact to underlying regions or layers. Generally, an opening through a dielectric exposing a diffusion region or an opening through a dielectric layer between polysilicon and a first metal layer is called a "contact opening", while an opening in other oxide layers such as an opening through an intermetal dielectric layer is referred to as a "via". For purposes of the claimed invention, henceforth "contact opening" or "contact region" will be used to refer to contact openings and/or via. The opening may expose a device region within the silicon substrate, such as a source or drain, or may expose some other layer or structure, for example, an underlying metallization layer, local interconnect layer, or structure such as a gate. After the opening has been formed exposing a portion of the region or layer to be contacted, the opening is generally cleaned with a sputter etch, e.g., a Radio-Frequency ("RF") sputter etch, and then the opening is filled with a conductive material deposited in the opening and in electrical contact with the underlying region or layer.

To form the openings a patterning layer of photoresist is first formed over the dielectric layer having openings corresponding to the regions of the dielectric where the dielectric layer openings are to be formed. In most modern processes a dry etch is then performed wherein the wafer is exposed to a plasma, formed in a flow of one or more gases. Typically, one or more halocarbons and/or one or more other halogenated compounds are used as the etchant gas. For example, $CF_4$, $CHF_3$ (Freon 23), $SF_6$, $NF_3$, and other gases may be used as the etchant gas. Additionally, gases such as $O_2$, Ar, $N_2$, and others may be added to the gas flow. The particular gas mixture used will depend on, for example, the characteristics of the dielectric being etched, the stage of processing, the etch tool being used, and the desired etch characteristics, i.e., etch rate, sidewall slope, anisotropy, etc.

Many of the etch characteristics are generally believed to be affected by polymer residues that deposit during the etch. For this reason, the fluorine to carbon (F/C) ratio in the plasma is considered an important determinant in the etch. In general, a plasma with a high F/C ratio will have a faster etch rate than a plasma with a low F/C ratio. At very low rates, i.e., high carbon content, polymer deposition occurs and etching ceases. The etch rate as a function of the F/C ratio is typically different for different materials. The difference is used to create a selective etch, by using a gas mixture that puts the F/C ratio in the plasma at a value that leads to etching at a reasonable rate for one material, and that leads to no etching or polymer deposition for another. For example, an etchant that has an etch rate ratio or a selectivity ratio of two to one for silicon nitride compared to silicon dioxide is an effective stripper of silicon nitride from the semiconductor substrate, because it will selectively strip silicon nitride over silicon dioxide on a substrate surface. An etchant that has an etch rate ratio or a selectivity ratio of 0.85 to one for silicon nitride compared to silicon dioxide is not considered an effective stripper of silicon nitride from the semiconductor substrate because the etchant will not effectively strip silicon nitride to the exclusion of silicon dioxide.

The selectivity of the etch process is a useful parameter for monitoring the process based on the etch rate characteristic of the particular etchant. As noted above, particular etchants or etchant chemistries attack different materials at different etch rates. With respect to dielectrics, for example, particular etchants attack silicon dioxide, BPTEOS, TEOS, and silicon nitride dielectrics at different rates. To make openings in a substrate comprising a contact region surrounded by different dielectric layers, e.g., a dielectric layer of TEOS surrounded by a dielectric layer of silicon nitride, a process will utilize different etchants to make openings through the different dielectrics. Thus, the different etch rates of particular dielectric layers for an etchant may be used to monitor the creation of an opening through a dielectric layer.

Further, by adjusting the feed gases, the taper of the sidewall in the etched opening of the dielectric can be varied. If a low sidewall angle is desired, the chemistry is adjusted to try to cause some polymer buildup on the sidewall. Conversely, if a steep sidewall angle is desired, the chemistry is adjusted to try to prevent polymer buildup on the sidewall. Varying the etch gas pressure, for example, has a significant effect on the shape of the opening. This is because the etchant ions generally arrive in a direction perpendicular to the substrate surface, and hence strike the bottom surfaces of the unmasked substrate. The sidewalls of etched openings, meanwhile, are subjected to little or no bombardment. By increasing the pressure of the etch gas, the bombardment directed toward the sidewalls is increased; by decreasing the pressure of the etch gas, the bombardment directed toward the sidewalls is decreased. The changing of the etch chemistry is also directly related to selectivity. Etchants that provide a near 90° sidewall angle are generally not highly selective while highly selective etches typically produce a sloped sidewall.

Following the dielectric etch(es) and prior to any conductive material deposition in a contact region, native oxide on top of the conducting layers in the contact region is removed or cleaned through a non-chemical sputter etch, e.g., an RF sputter etch. In addition to alleviating the contact region of native oxide, the sputter etch can erode any insulating dielectric layer or layers. Thus, the parameters of the sputter etch must be carefully monitored so as not to excessively erode the insulating dielectric layer(s) and expose other underlying conductive material. Exposing insulated conductive material adjacent to the conductive material in the contact region results in poor quality contacts or a short circuit through the underlying conductive material. For a thorough discussion of oxide etching, see S. Wolf and R. N. Tauber, *Silicon Processing for the VLSI Era*, Vol. 1, pp. 539–85 (1986).

The preceding discussion focused on the making of openings, e.g., contact openings, in dielectric material on a semi-conductor substrate. The same principles are used in constructing device regions with a dielectric layer or layers. As geometries shrink, the forming of discrete devices on a semiconductor substrate becomes more specialized. Specialized deposition and etching techniques permit the density of semiconductor elements on a single chip to greatly increase, which translates into larger memory, faster operating speeds, and reduced production costs.

A typical metal oxide semiconductor (MOS) transistor, e.g., NMOS or PMOS transistor, generally indudes source/drain regions in a substrate, and a gate electrode formed above the substrate between the source/drain regions and separated from the substrate by a relatively thin dielectric. Contact structures can be inserted to the source/drain regions and interlays can overlie the contact structures and connect neighboring contact structures. These contact structures to the diffusion region are isolated from the adjacent gate by dielectric spacer or shoulder portions. The dielectric spacer or shoulder portions also isolate the gate from the diffusion region.

Conventional contact structures limit the area of the diffusion region, because the contact hole is aligned to these regions with a separate masking step, and extra area must be allocated for misalignment. Proper alignment is necessary to avoid shorting the contact structure to the gate or the diffusion well. The larger contact area means a smaller density of elements on a structure. The larger contact area is also responsible for increased diffusion-to-substrate junction capacitance, which limits device speed.

A self-aligned contact eliminates the alignment problems associated with conventional contact structures and increases the device density of a structure. A self-aligned contact is a contact to a source or drain diffusion region. A self-aligned contact is useful in compact geometries because it can overlap a conducting area to which it is not supposed to make electrical contact and can overlap the edge of a diffusion region without shorting out to the well beneath Consequently, less contact area is needed and gates or conductive material lines, e.g., polysilicon lines, can be moved closer together allowing more gates or lines on a given substrate than traditional contacts.

Figure 1A:
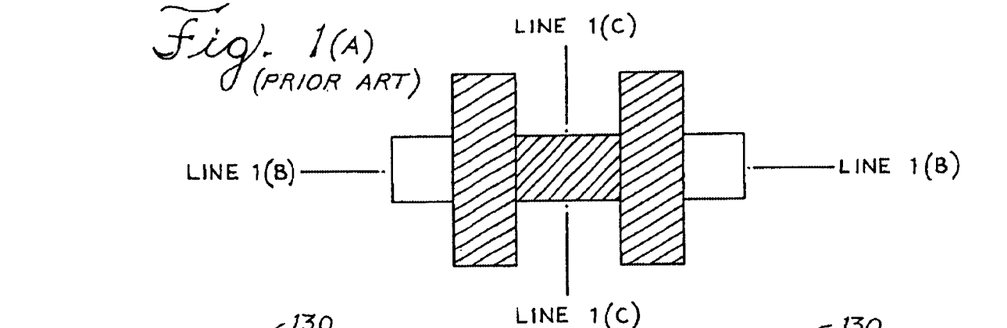
FIG. 1(A) is a planar top view of the self-aligned contact.
Figure 1B:
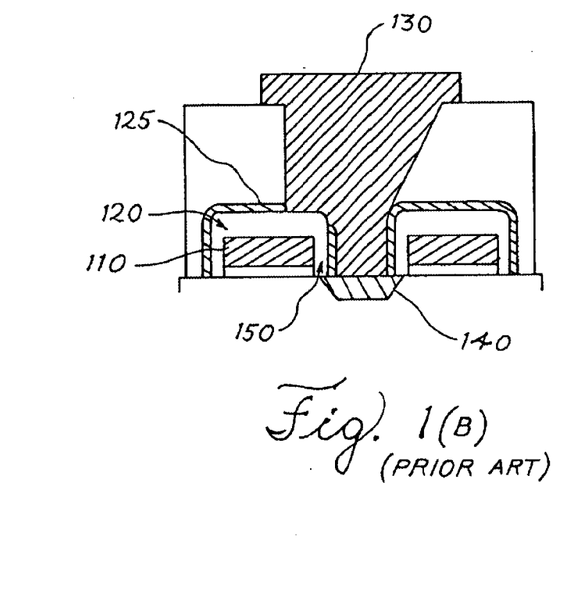
FIG. 1(B) is a cross-sectional planar side view of the self-aligned contact taken through line 1(B) of FIG. 1(A).
Figure 1C:
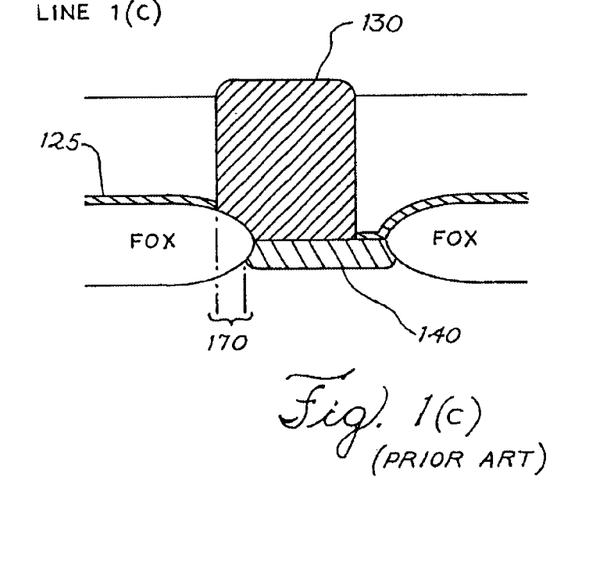
FIG. 1(C) is a cross-sectional planar side view of the self-aligned contact taken through line 1(C) of FIG. 1(A).

FIG. 1 illustrates a self-aligned contact 130 between two gate structures. FIG. 1(A) is a planar top view of the contact 130. FIG. 1(B) is a planar cross-sectional view of the self-aligned contact 130 between a pair of gates taken through line 1(B) of FIG. 1(A). FIG. 1(C) is a planar cross-sectional view of the self-aligned contact 130 between a pair of gates taken through line 1(0) of FIG. 1(A).

The self-aligned contact 130 is a contact to a source or drain diffusion region (n+ or p+ silicon) 140 that can overlap the edge of the diffusion region 140 without shorting out to a well beneath the diffusion region 140. This can be seen most illustratively through FIG. 1(C). In FIG. 1(C), the contact 130 does not lie directly in the diffusion region 140, but is misaligned and slightly overlaps the field oxide (designated by FOX in FIG. 1(C). In this illustration, the self-aligned contact 130 is not directly over the diffusion region 140 but extends over (i.e., overlaps) a well portion 170. The self-aligned contact 130 does not short to the well portion 170 because the self-aligned contact 130 is separated from the well 170 by the field oxide.

The self-aligned contact 130 is separated from a conducting polysilicon layer 110 by an encapsulating dielectric layer 120 such that the contact 130 can also overlap the polysilicon layer 110 without making electrical contact to the layer 110 or gate. The polysilicon layer 110 is separated from the source/drain diffusion region 140 by a dielectric spacer or shoulder 150 of the same or different dielectric material as the dielectric layer 120 directly above the conducting polysilicon layer 110.

A distinct dielectric etch stop layer 125 overlies the encapsulating dielectric layer 120. The etch stop layer 125 permits subsequent etching of the substrate without risk of exposing the device structures and layers because the device structuring and layers are protected from excessive etching by the etch stop layer 125. The diffusion contact is self-aligning because the structure can be etched to the substrate over the source/drain diffusion region 140 while the dielectric spacer 150 protects the polysilicon layer 110. Even if a photoresist that protects the polysilicon layer 110 from the etchant is misaligned with respect to the polysilicon layer 110, the dielectric spacer 150 prevents shorts to the polysilicon layer 110 when the contact 130 is provided for the diffusion region 140.

Figure 2A:
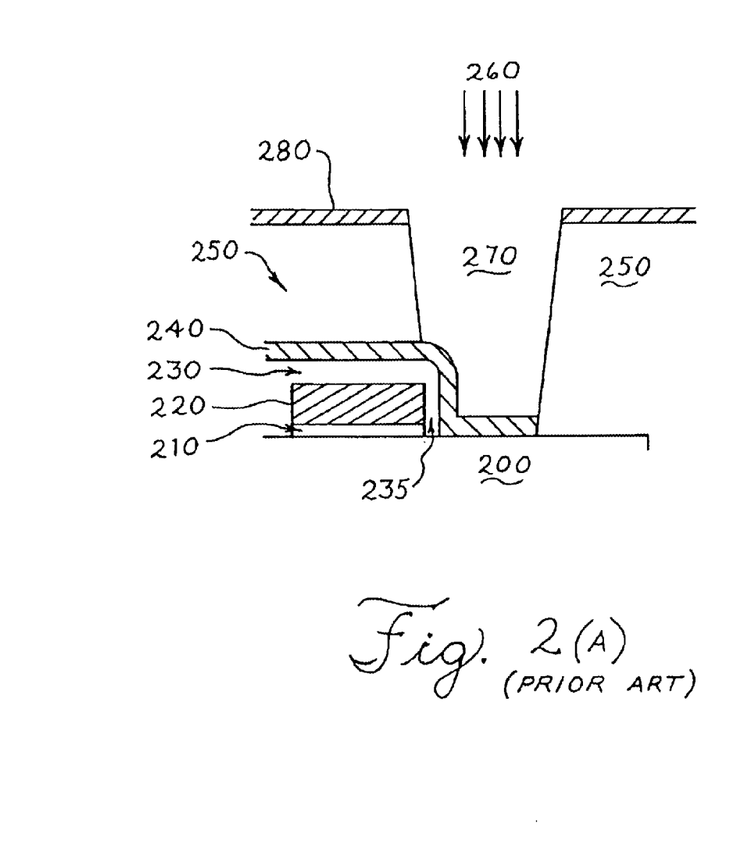
FIG. 2(A) illustrates a high selectivity etch of an etch stop insulating layer.

The current practice with respect to forming contact regions, particularly self-aligned contact regions, that are in electrical contact with gates, interconnect lines, or other structures in small feature size structures is to utilize etchants with high selectivity to protect underlying regions, like the etch stop layer and the first insulating layer. FIG. 2 illustrates a typical prior art process of forming a self-aligned contact region adjacent to a gate. In FIG. 2(A), a gate oxide layer 210 is formed on a substrate 200 with a conducting layer, for example a polysilicon layer 220, overlying the gate oxide layer 210, and an insulating layer, for example a TEOS layer 230, overlying the polysilicon layer 220. Adjacent to the polysilicon layer 220 is a contact opening region 270. The polysilicon layer 220 is separated from the contact region 270 by an insulating spacer portion, for example a TEOS spacer portion 235. A separate insulating or etch stop layer, for example a silicon nitride layer 240, overlies the TEOS layer 230 and the contact region 270. A blanket layer, for example a doped insulating layer like a BPTEOS layer 250, planarly overlies the etch stop layer 240.

A layer of photoresist material 280 overlies the planarized BPTEOS layer 250 to expose the contact opening 270. In FIG. 2(A), a contact opening 270 has been opened through the BPTEOS layer 250. The etchant utilized to make the opening had a high selectivity toward BPTEOS relative to silicon nitride. When the contact opening 270 was formed through the BPTEOS material, the etchant did not etch or did not effectively etch the silicon nitride layer 240 material. Hence, the description of the silicon nitride layer 240 is described as an etch stop layer. The silicon nitride etch stop layer 240 protected the underlying TEOS layer 230 and spacer portion 235 so that the polysilicon layer 220 completely encapsulated.

FIG. 2(A) illustrates an etch 260 to remove the silicon nitride etch stop layer 240. In the etch 260 illustrated in FIG. 2(A), a high selectivity etch toward silicon nitride relative to the underlying TEOS layer 230 material is practiced to efficiently etch the silicon nitride layer 240 and to protect the underlying TEOS layer 230 from the etchant. An example of a high selectivity etch recipe to effectively strip silicon nitride as compared to the TEOS layer is 30 sccm $CHF_3$ and 30 sccm $O_2$ at 60 mtorr and 100 watts of power. The result of the high selectivity etch is illustrated in FIG. 2(B).

Figure 2B:
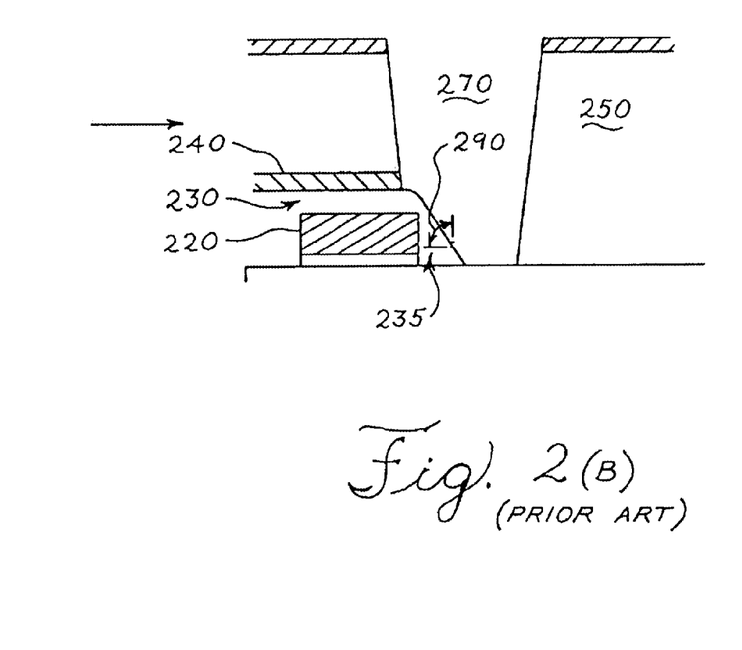
FIG. 2(B) illustrates the results of that etch.

FIG. 2(B) shows that the silicon nitride selective etch effectively removed silicon nitride layer 240 from the contact opening 270. The selective etch for silicon nitride compared to TEOS material, however, left the TEOS layer 230 with a spacer portion 235 wherein the spacer portion 235 is sloping or tapered toward the contact opening 270. This result follows even where the spacer portion 235 is originally substantially rectangular as in FIG. 2(A). The properties of the highly selective etch of the overlying etch stop layer 240 will transform a substantially rectangular spacer into a sloped spacer. FIG. 2(B) presents a polysilicon layer 220 encapsulated in a TEOS layer 230 with a spacer portion 235 adjacent to the contact opening 270, the spacer portion 235 having an angle 290 that is less than 85°.

In addition to providing stopping points or selectivity between materials, the use of high selectivity etches to form sloped spacer portions is the preferred practice because the sloped shape will result in good step coverage by the metal that is deposited into it. The filling of contact openings or gaps (i.e., gap fill) is an important consideration because it relates directly to the reliability of a device. If an opening is not completely filled with an insulative material, for example, and a gap is created, a subsequent conductive material deposit can fill the gap which can lead to shorting. Sloped contact openings are easier to completely fill than boxy structures because the transition between sloped structures and openings is smooth compared to the abrupt transitions between boxy structures and openings. Because of concerns for complete gap fill and good step coverage, industry preference is for sloped spacers and planar deposition layers similar to that shown in FIG. 2(B).

Figure 3:
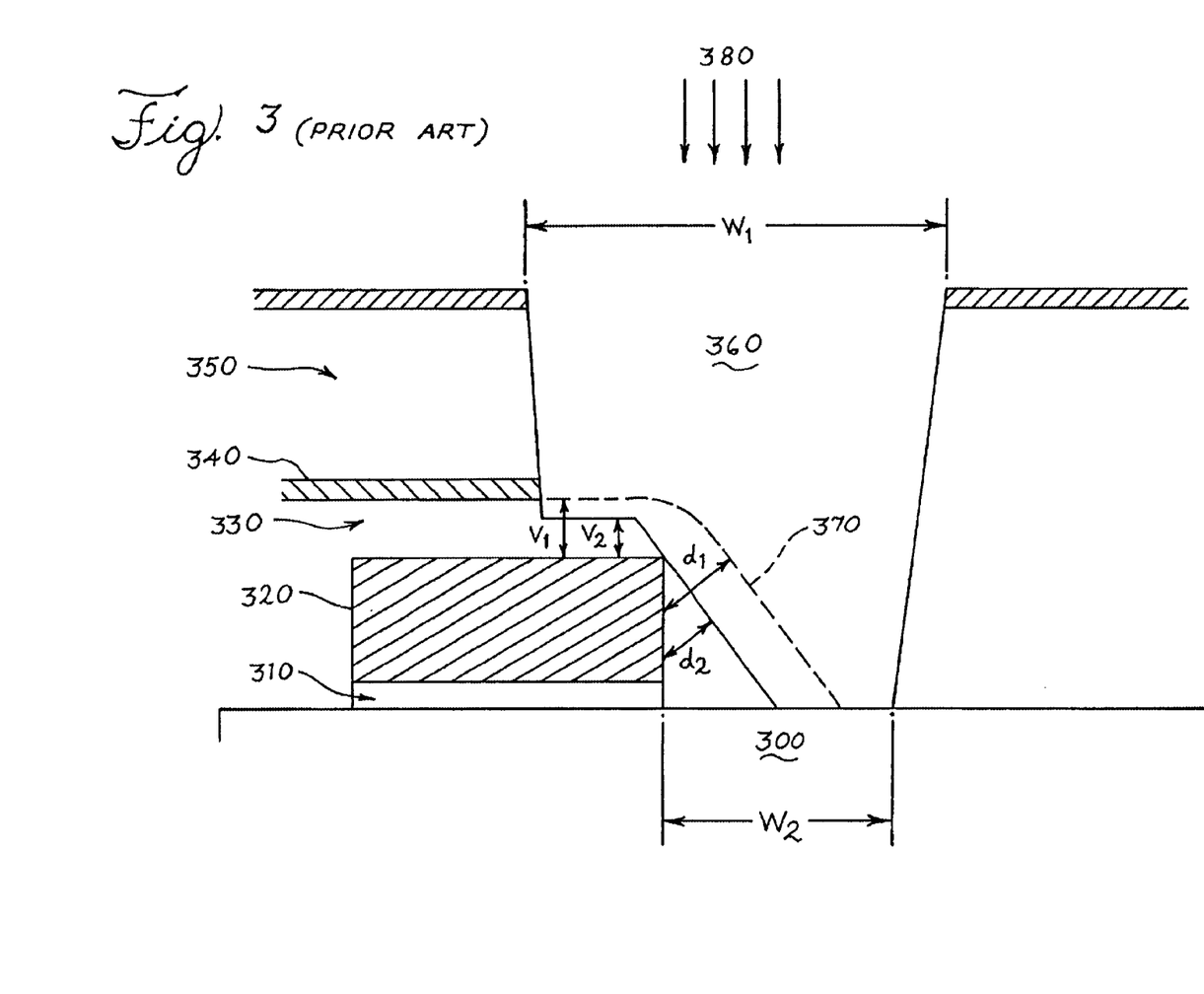
FIG. 3 is a cross-sectional side view of a prior art contact opening formation during a sputter cleaning etch.

Once the contact opening is made, the opening is cleaned with a sputter etch, e.g., an RF sputter etch, before conductive material is added to fill the opening or gap. The RF sputter etch that is used to clean the contact opening in the process described above will attack and erode a portion of the insulating spacer surrounding the conducting portion and adjacent to the contact region. FIG. 3 illustrates a prior art substrate with a gate and a contact region undergoing an RF sputter etch 380. In FIG. 3, a gate oxide 310 is formed on a substrate 300 with a polysilicon layer 320 overlying the gate oxide 310 and an insulating layer, for example a TEOS layer 330 overlying the polysilicon layer 320. A distinct insulating layer, for example a silicon nitride etch stop layer 340, overlies the TEOS layer 330 and this etch stop layer 340 is covered by a third insulating layer, for example a BPTEOS blanket layer 350. Adjacent to the gate is a contact region 360. An etch of the silicon nitride etch stop layer 340 with a high selectivity etch for silicon nitride relative to the underlying TEOS layer material produced a gate with a sloping or tapered spacer portion 370 of TEOS material, illustrated in ghost lines. A subsequent RF sputter etch 380 is utilized to clean the contact region 360.

Although brief and designed to clean the contact region, the RF sputter etch 380 will erode a portion of the insulating TEOS spacer portion 370. The dynamics of the sputter etch 380 are that it proceeds vertically, directing high-energy particles at the contact region. The sloping or tapered spacer portion 370 adjacent the polysilicon layer 320 and separating the polysilicon layer 320 from the contact region 360 is struck by the high-energy particles of the RF sputter etch 380. Because the spacer portion 370 is sloping or diagonal, a significant surface area portion of the spacer portion 370 is directly exposed to the high-energy particles from the RF sputter etch 380. Further, with sloping spacers, or spacers having an angle relative to the substrate surface of less than 85° the vertical portion of the dielectric layer (i.e., that portion above the polysilicon layer 320) decreases much less than the diagonal portion of the spacer. In terms of measuring TEOS material removal during the RF sputter etch 380 in FIG. 3, the difference between $d_1$ and $d_2$ is greater than the difference between $v_1$ and $V_2$. Thus, in conventional prior art self aligned contact structures, the diagonal thickness of the TEOS spacer portion 370, rather than the vertical thickness of the TEOS layer 330, determines the minimum insulating layer thickness for the gate.

For gate structures having minimum diagonal insulative spacer portions of 500 Å or less, the result of the sputter etch 380 is that the sputter etch 380 laterally erodes the diagonal portion of the TEOS spacer portion 370 adjacent to the contact region to a point where the polysilicon layer 320 is no longer isolated from the contact region 360 by an insulating layer. In that case, there is a short circuit through the underlying conductive material when the contact region 360 is filled with conductive material. This result follows because the conventional RF sputter etch 380 utilized for cleaning the contact region 360 results in an approximately 200–500 Å loss of the spacer material. Further, process margins generally require that the device spacer have a final minimum thickness (after all etches, doping, and deposits) of at least 500 Å. Thus, eliminating alignment sensitivity for conventional small feature size structures, including self-aligned contact structures, requires a final (i.e., at the time of contact deposition) minimum insulating spacer of more than 500 Å and preferably on the order of 1000–1500 Å or greater to fulfill requirements for an adequate process margin, complete gap fill, and device reliability.

To construct structures having a minimum insulative spacer portion of more than 500 Å directly effects the number of structures that can be placed on a device, such as a chip. The construction of structures having a minimum insulative spacer portion of more than 500 Å requires that the pre-etch-stop-etch spacer be bigger or thicker to yield an effective spacer after the etching processes. In such cases, the structures must be separated a distance such that the contact area opening is sufficient enough for an effective contact. This spacing requirement directly limits the number of structures that can be included on a device. In small feature size structures, particularly structures utilizing self-aligned contacts, the width of contact openings is approximately 0.6 microns at the top of the planarized layer and 0.2 microns at the base of the contact opening. FIG. 3 indicates the difference in contact opening widths for the same contact in prior art structures. $w_1$ represents the width at the top of the planarized layer and $w_2$ represents the width at the base of the contact region 360. Further, an aspect ratio can be defined as the height of a structure (field oxide plus conductive layer plus first insulative layer plus etch stop layer, if any) relative to the width of the base of a contact opening (i.e., the distance between adjacent spacers). Typical aspect ratios for self-aligned contact structures target ratios of 1.0–2.4. This prior art range is not achievable with any device reliability. To achieve aspect ratios of 1.0–2.4 requires minimum spacer portions of less than 1000 Å and preferably on the order of 500 Å. As noted above, the minimum spacer portions required for aspect ratios of 1.0–2.4 cannot withstand the sputter etch and will result in the exposure of the underlying polysilicon gate and short circuiting with the contact.

There is a need for cost effective structures wherein the individual devices are as close together as possible while maintaining device reliability and an adequate process margin and assuring complete gap fill. There is a need for a device and for a process to manufacture such a device whereby there is provided a contact opening with no alignment sensitivity relative to a gate electrode or other structure and whereby the gate electrode does not fall within the contact opening but remains isolated from the contact opening by an insulating layer. The process must be compatible with gate electrode insulating spacers of less than 500 Å. The device resulting from the needed process should be capable of maintaining high quality contacts between the conductive material in the contact region and the adjacent conductive gate or other structure.

SUMMARY OF THE INVENTION

The invention relates to a process for minimizing lateral spacer erosion of an insulating layer on an enclosed contact region, and a device including a contact opening with a small alignment tolerance relative to a gate electrode or other structure. The process provides high quality contacts between a conductive material in the contact region and a device region, such as a source or drain, or some other layer or structure. The process comprises the well known step of forming a conductive layer on the semiconductor body adjacent a contact region. This is followed by the forming of a first insulating layer adjacent said conductive layer and the contact region. A selected area is masked with photoresist and the first insulating layer and the conductive layer are etched to form a device structure, such as a gate, adjacent the contact region. Next, insulating lateral spacers are added to the device structure to isolate the conductive portion of the device. The insulating spacers are etched so that the device comprises an insulating layer overlying a conductive layer with a lateral spacer portion adjacent the contact region wherein the spacer portion has a substantially rectangular profile. A distinct insulating layer or etch stop layer is then formed adjacent to the first insulating layer and over the contact region. A third insulating layer or blanket layer is then optionally formed over the etch stop layer. The blanket layer may or may not be planarized.

If a blanket layer is included, an etchant is utilized to etch a contact opening through the exposed portion of the blanket layer to the etch stop layer. Next, a second etch or etch stop etch is performed to remove the etch stop layer material from the contact region. The etch-stop etch is also almost completely anisotropic, meaning that the etchant etches in one direction-in this case, vertically (or perpendicular relative to the substrate surface) rather than horizontally. The etch removes the etch stop insulating layer and retains the substantially rectangular lateral spacer portion of the first insulating layer. The anisotropic etch etches primarily the exposed etch stop material that lies normal to the direction of the etch. Thus, the etch removes the etch stop material covering the area of the contact region but does not significantly etch the etch stop material adjacent to the spacer(s). The etch stop layer on the spacer adds dielectric thickness between the conductive layer and any contacting conductor. In general, the etching conditions utilized for the etch-stop etch have a low selectivity for etching the etch stop layer compared to the underlying insulating material.

The etch-stop etch may be followed by a sputter etch to clean the contact region. Unlike prior art processes whereby the sputter etch erodes the underlying sloping lateral spacer portion of the first insulating layer adjacent to the conducting layer, the sputter etch does not significantly erode the substantially rectangular lateral spacer of the first insulating layer, thus allowing the conductive layer of the device structure to remain completely isolated or insulated by a spacer comprised of the first insulating layer and some etch stop layer material.

The structure contemplated by the invention is an effective device for small feature size structures, particularly self-aligned contacts. The structure consists of first and second conducting layers spaced apart by a region with an area defined in the substrate; an insulating layer encapsulating each conductive layer, wherein the insulating layer includes lateral spacer portions; and an etch stop layer adjacent the insulating layer and over the first and second conducting layers. The invention contemplates that the structure region has a first width between the first and second conducting layers, and a second width between the lateral spacer portions of the insulating layer adjacent to the first and second conducting layers, wherein the region has an aspect ratio of 1.0–2.4. The aspect ratio is defined as the height of the apparatus relative to the second width of the region. Thus, the invention contemplates larger contact openings for effective contacts, reduced device feature size, and increased device density, while maintaining aspect ratios similar to larger, less dense devices in the prior art. The invention further contemplates that the structure has a minimum insulating layer thickness of 400 Å and that this minimum thickness is determined by the thickness of the insulating layer deposited vertically on the structure.

The device is capable of maintaining high quality, reliable contacts between the conductive material in the contact region and the underlying device region, such as a source or drain, or some other layer or structure. The device contemplates minimum contact opening base widths of 0.2 microns and minimum contact opening widths of 0.5 microns when measured from the top of a planarized layer, and aspect ratios (i.e., height of structure including the etch stop layer relative to the width of the base of a contact opening between the spacers) on the order of 1.0–2.4.

Additional features and benefits of the invention will become apparent from the detailed description, figures, and claims set forth below.

The phrase "substantially rectangular" means that a side of the spacer has an angle relative to the substrate surface of more than 85°.

BRIEF DESCRIPTION OF THE DRAWINGS

The features, aspects, and advantages of the present invention will become more thoroughly apparent from the following detailed description, appended claims, and accompanying drawings in which:

FIG. 1 illustrates a self-aligned contact to a diffusion region.

FIG. 2 is a cross-sectional side view illustrating the formation of a prior art contact opening.

FIG. 4 presents a cross-sectional planar side view of the preparation of a series of gates on a semiconductor substrate surface.

DETAILED DESCRIPTION OF THE INVENTION

The invention is a device and a process whereby there is provided a contact opening with no alignment sensitivity relative to a gate electrode or other structure such that the gate electrode does not fall within the contact opening but remains isolated from the contact opening by an insulating layer. The structure contemplated by the invention is an effective device for small feature size structures, particularly self-aligned contacts, because it is capable of maintaining high quality contacts between the conductive material in the contact region and the underlying device region, such as a source or drain, or some other layer or structure with minimum contact opening base widths (i.e., at the base of the contact openings) of 0.2 microns and minimum contact opening widths of 0.5 microns when measured from the top of a planarized layer, minimum encapsulating layer thicknesses of 400 Å, and aspect ratios (i.e., height of structure including the etch stop layer relative to the width of the base of a contact opening between the spacers) in the range of 1.0–2.4.

In the following description, numerous specific details are set forth such as specific materials, thicknesses, processing steps, process parameters, etc., in order to provide a thorough understanding of the invention. It will be obvious, however, to one skilled in the art that these specific details need not be employed to practice the invention. In other instances, well known materials or methods have not been described in detail in order to avoid unnecessarily obscuring the invention. Furthermore, in the following discussion, several embodiments of the invention are illustrated with respect to specific structures, oxide layers, and oxide layer openings. It will be appreciated that each of the methods described herein can be utilized on a variety of structures and oxide layers, to form any type of opening, and each of the insulating layer etching methods described herein is not necessarily restricted to the structure and/or insulating layer in conjunction with which it is described. Further, any of the methods described herein may be performed as part of a multistep etch comprising additional etch processes.

FIG. 4 presents a cross-sectional view of the preparation of a series of gates or transistors on a semiconductor substrate surface. Referring to FIG. 4(A), the semiconductor substrate 400 can be either p- or n-type, and includes diffusion regions 405, such as sources or drains, that are heavily doped with the opposite dopant type of the substrate. An n-type first conducting layer 415 of polysilicon doped by implantation with phosphorous to a resistivity of 50–200 ohms/square is deposited over the diffusion regions 405. The polysilicon layer 415 is deposited by low pressure CVD ("LPCVD") using an LPCVD tube and $SiH_4$ gas at 200–400 mtorr with a thickness of 2000–3000 Å. It should be appreciated by those skilled in the art that this conducting layer 415 could instead be a p-type conducting layer or a metallic conductor of, for example, W, Mo, Ta, and/or Ti, or that this conducting layer 415 could also be a silicide, consisting of $WSi_2$, $MoSi_2$, $TaSi_2$, PtSi, PdSi, or that this conducting layer 415 can further be a layered structure consisting of a silicide on top of doped polysilicon.

Figure 4A:
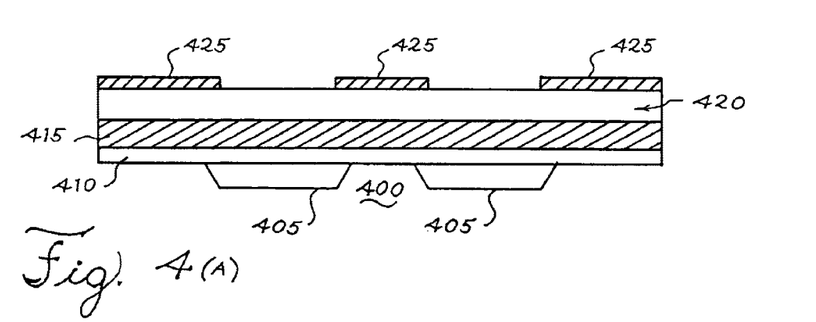
FIG. 4(A) illustrates a cross-sectional planar side view of an insulating layer adjacent to a conducting layer, both layers overlying two diffusion regions.

The polysilicon layer 415 overlays an insulating dielectric layer 410 such as doped or undoped silicon dioxide. The dielectric layer 410 may comprise a single oxide, or several layers formed by various methods. For example, one or more layers of oxide may be deposited by plasma enhanced chemical vapor deposition ("PECVD"), thermal CVD ("TCVD"), atmospheric pressure CVD ("APCVD"), subatmospheric pressure CVD ("SACVD"), utilizing, for example, TEOS and oxygen, or TEOS and ozone chemistries. As used herein, reference to, for example, a PECVD TEOS oxide denotes an oxide layer deposited by PECVD utilizing TEOS chemistry. Additionally, one or more layers of dielectric layer 410 may be a spin-on-glass ("SOG") layer.

A TEOS dielectric layer 420 with a total thickness of approximately 3000 Å overlies the conducting layer 415. It should be appreciated by those of ordinary skill in the art that this TEOS layer 420 could instead be an insulating layer of, for example, silicon dioxide, $SiO_2$, ONO, silicon nitride ($Si_xN_y$), or silicon oxynitride ($SiO_xN_y$). Additionally, the insulating layer 420 may be undoped or may be doped, for example with boron, phosphorous, or both, to form, for example, borophosphosilicate glass ("BPSG"), phosphosilicated glass ("PSG"), and borophosphosilicate tetraethyl orthosilicate ("BPTEOS"). Further, the dielectric layer 420 may comprise a single layer oxide, like TEOS, or several layers formed by various methods.

Figure 4B:
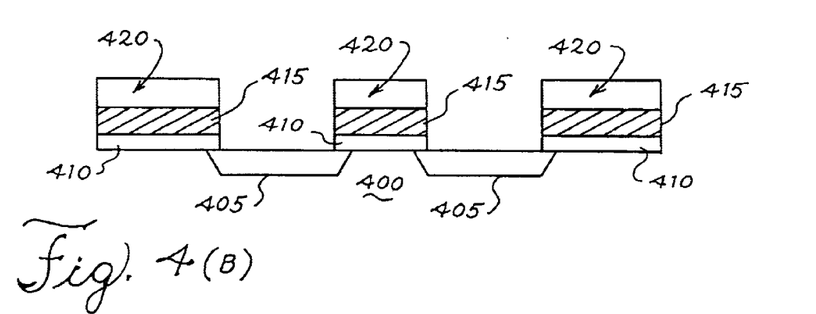
FIG. 4(B) illustrates a cross-sectional planar side view of a series of gates consisting of insulating material adjacent conducting material.

Referring further to FIG. 4(A), a photoresist masking layer 425 is deposited over the TEOS dielectric layer 420. The photoresist masking layer 425 is patterned to enable exposure of diffusion regions 405 in the semiconductor substrate. Referring to FIG. 4(B), a series of photolithographic etches are performed to remove the TEOS layer 420 material and the polysilicon layer 415 from the diffusion regions 405 to form contact openings. The etches are performed using a parallel plate plasma etcher with a power of 200–300 watts. First, a fluorocarbon photolithographic etch, $CHF_3/C_2F_6$ at 50 mtorr, is performed to remove the insulating TEOS material from areas adjacent to and including the diffusion regions 405. This is followed by a single polysilicon photolithographic etch using a chlorine plasma ($Cl_2$/He) to define a polysilicon conducting layer 415 above the transistor or gate regions.

The process described thus far has been described in terms of multiple etching steps involving multiple passes through the etch chamber. It should be recognized by one of ordinary skill in the art that the etching steps can be combined into a multiple-step etch whereby the etch may be accomplished with one pass through the etch chamber, the etcher changing chemistries and executing the multiple etches sequentially.

Figure 4C:
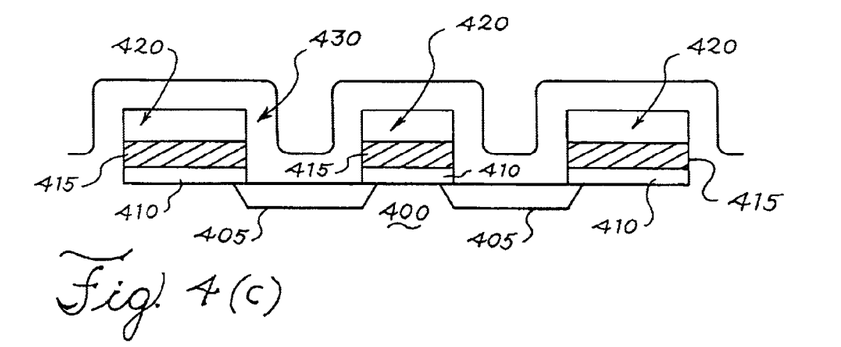
FIG. 4(C) illustrates a cross-sectional planar side view of the deposition of additional insulating material over the series of gates, the additional insulating material to be used for the formation of spacer portions adjacent the contact or diffusion regions.
Figure 4D:
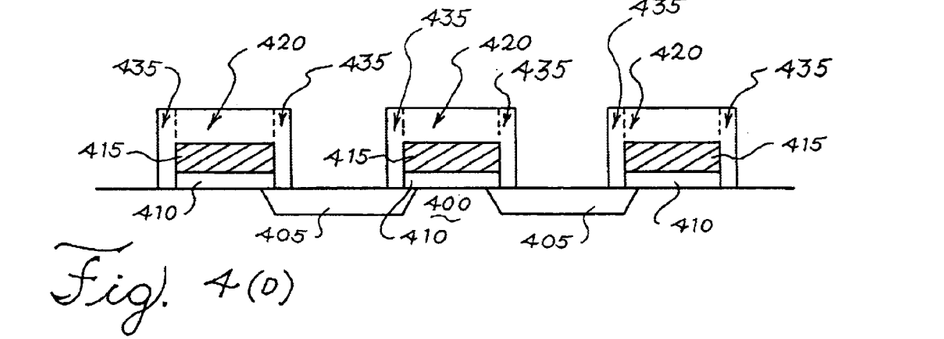
FIG. 4(D) illustrates a cross-sectional planar side view of a series of gates completely encapsulated in insulating material wherein the spacers of the insulating material adjacent the contact or diffusion regions have substantially rectangular profiles.

Referring to FIGS. 4(C) and 4(D), spacers are formed between the polysilicon layer 415 of the gates and the contact openings by depositing an additional of conformal layer of TEOS material 430 over the structure and etching spacer portions extending into the contact openings and adjacent to the polysilicon layer 415 approximately 1500 Å in width. The spacer portions 435 of the TEOS layer 430 are demarked by ghost lines in FIG. 4(D). The spacers 435 serve to insulate the polysilicon layers 415 from the conducting material that will fill the contact openings and prevent the gates from overlapping the diffusion regions 405. The spacers 435 serve to completely encapsulate the polysilicon layers 415 of the individual gates. As shown in FIG. 4(C), care is taken to etch the spacers 435 such that the spacers 435 have a substantially rectangular profile. This is accomplished using a low bias and high pressure etch (2.8 torr, 140 sccm He, 30 sccm $CHF_3$, 90 sccm $CF_4$, and 850 watts power), that results in low polymer formation. At this point, the preferred embodiment of the invention contemplates that the TEOS layer can have a minimum vertical width of approximately 3000 Å and spacers with a minimum width of approximately 1000 Å.

Figure 4E:
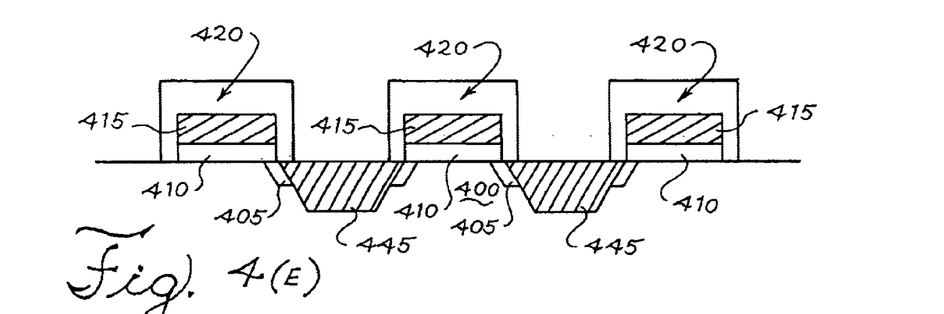
FIG. 4(E) illustrates a cross-sectional planar side view of a series of gates encapsulated with insulating material, wherein the diffusion regions are implanted with, for example, a silicide.

Referring to FIG. 4(E), the diffusion regions 405 are next implanted with a suitable dopant utilizing conventional techniques. The dopant may be implants of arsenic, phosphorous, or boron. Subsequently, silicides, for example $WSi_2$ and $TiSi_2$, may also be formed. FIG. 4(E) illustrates silicide formation 445 in the diffusion regions 405.

Figure 4F:
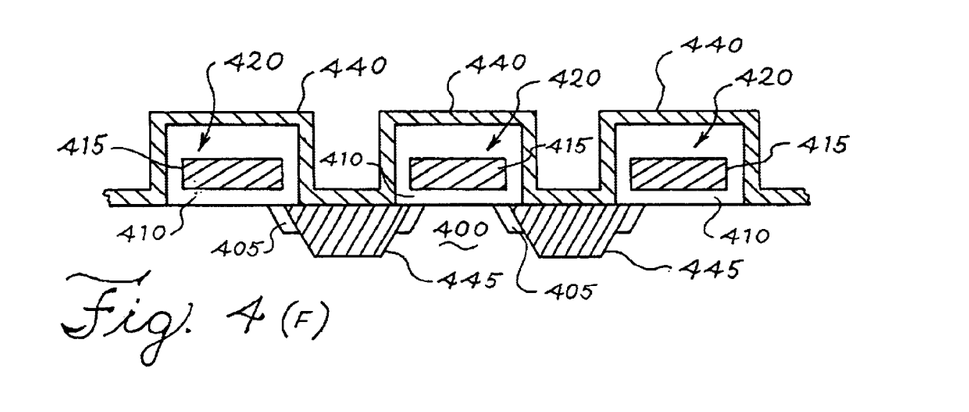
FIG. 4(F) illustrates a cross-sectional planar side view of a series of gates encapsulated with insulating material and an insulating etch stop layer overlying the insulating material.

Referring to FIG. 4(F), overlying the TEOS layer 420 is deposited a second distinct dielectric or etch stop layer 440, in this example, a silicon nitride ($Si_xN_y$) layer 440, with a total thickness of 700 angstroms. It should again be appreciated by those of ordinary skill in the art that this silicon nitride layer 440 could instead be an insulating layer of, for example, silicon dioxide, $SiO_2$, ONO, or $SiO_xN_y(H_z)$. Additionally, the silicon nitride etch stop layer 440 may be undoped or may be doped, for example with boron, phosphorous, or both, to form, for example, borophosphosilicate glass ("BPSG"), phosphosilicated glass ("PSG"), and borophosphosilicate tetraethyl orthosilicate ("BPTEOS"). Further, the etch stop layer 440 may comprise a single silicon nitride layer or several layers formed by various methods. It is important that the etch stop layer 440 be different or distinct from the underlying insulating layer.

The invention contemplates that at this point the structure has an aspect ratio of 1.0–2.4. As used herein, an aspect ratio is defined as the ratio of the height of a contact opening measured to the top of the horizontal portion of the etch stop layer 440 to the base width of the contact opening between the insulating spacers 435. For example, an embodiment of the invention contemplates contact opening heights of 5300 Å (0.53 μm) relative to widths of 0.32 μm to give aspect ratios of 1.6.

Figure 4G:
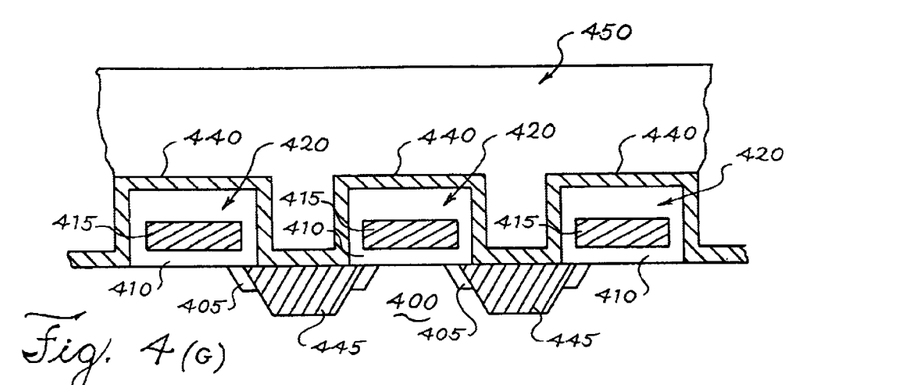
FIG. 4(G) illustrates a cross-sectional planar side view of a series of gates encapsulated with insulating material, an etch stop layer overlying the insulating material, and a distinct planarized insulating layer overlying the etch stop layer.

Referring to FIG. 4(G), an optional dielectric blanket layer 450 is next deposited adjacent to the etch stop layer 440. The blanket layer 450 may or may not be planarized. In FIG. 4(G), the blanket layer 450 is planarized. The planarized blanket layer 450 facilitates the formation of an interconnect layer that might later be deposited over the contact regions. The blanket layer 450 in FIG. 4(G) is a doped silicate glass, for example BPTEOS. It should be appreciated by those of ordinary skill in the art that this BPTEOS layer 450 could instead be another doped insulating layer of, for example, BPSG or PSG, or an undoped insulating layer of silicon dioxide, $SiO_2$, ONO, or $SiO_xN_y$. Further, the blanket layer 450 may comprise a single oxide, like BPTEOS, or several layers formed by various methods.

Figure 4H:
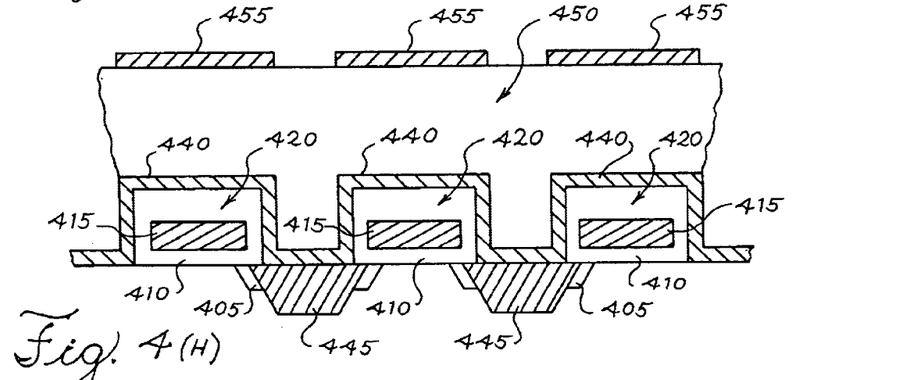
FIG. 4(H) illustrates a cross-sectional planar side view of a series of gates encapsulated with insulating material, an etch stop layer overlying the insulating material, a distinct planarized insulating blanket layer overlying the etch stop layer, and a photoresist patterning layer deposited over the blanket layer.
Figure 4I:
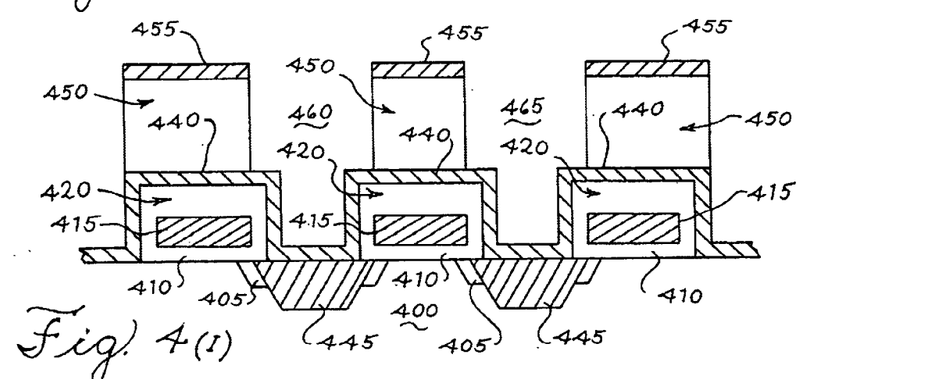
FIG. 4(I) illustrates a cross-sectional planar side view of a series of gates encapsulated with insulating material, an etch stop layer overlying the insulating material, a distinct planarized insulating blanket layer overlying the etch stop layer, and contact openings etched through the blanket layer above the diffusion regions, but separated from the diffusion regions by the etch stop layer.

Next, as shown in FIG. 4(H), a photoresist pattern or mask layer 455 is deposited adjacent to the blanket layer 450 such that the diffusion regions 405 can be exposed. This is followed by a photolithographic etch of the BPTEOS blanket layer 450 in the contact openings. The etch is a fluorocarbon photolithographic etch (7 sccm $CHF_3$, 6 sccm Freon 134a) at 29 mtorr. The etch reveals a pair of contact openings 460 and 465 above the diffusion regions 405, as shown in FIG. 4(I).

Figure 4J:
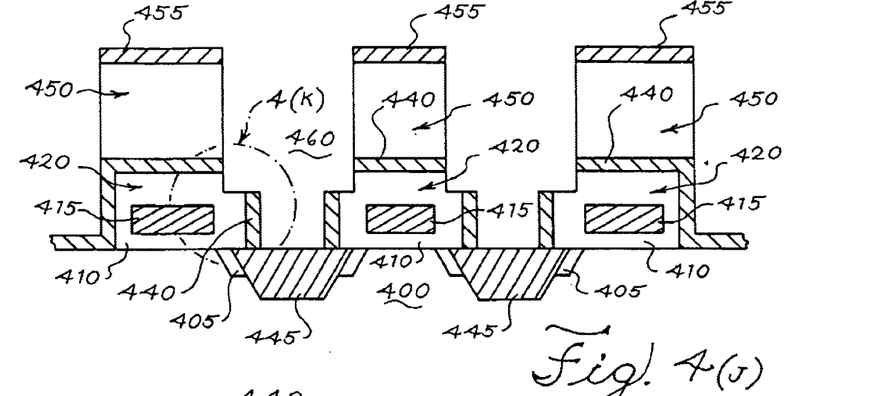
FIG. 4(J) illustrates a cross-sectional planar side view of a series of gates encapsulated with insulating material, an etch stop layer overlying the insulating material, a distinct planarized insulating blanket layer overlying the etch stop layer, and contact openings to the diffusion regions.

Referring to FIG. 4(J), a photoresist material (not shown) is overlayed in contact opening 465 adjacent to the etch stop layer 440 to protect the etch stop material in contact opening 465 from a subsequent photolithographic etch to remove the etch stop layer 440. Next, a photolithographic etch, (900 mtorr, 100 sccm, He, 85 sccm $C_2F_6$, and 225 watts power using a Lam 4400 Series plasma etching system) is performed to remove the etch stop layer 440 from contact opening 460. The etch conditions for this etch are low bombardment/high neutral flux conditions.

Figure 4K:
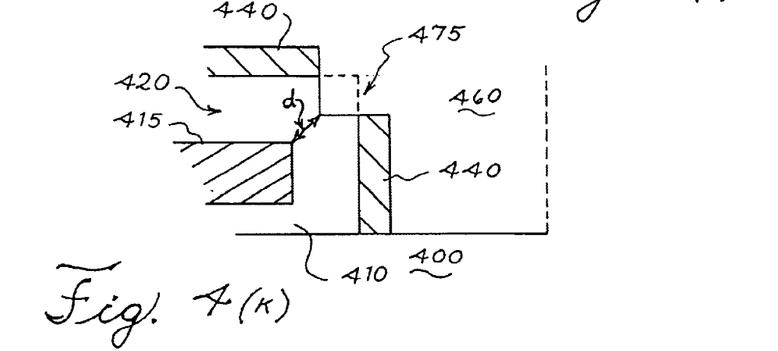
FIG. 4(K) illustrates a close-up cross-sectional planar side view of a circled portion of FIG. 4(J), the circled portion labeled 4(K) and illustrating the spacer portion of a contact region following an etch of the etch stop layer from the contact region.

FIG. 4(K) is a close-up view of the cross-sectional portion of contact opening 460 in FIG. 4(J). The etch proceeds anisotropically, primarily removing etch stop material lying in a horizontal plane relative to the vertical direction of the etchant ions. The etchant removes material primarily from the base of the contact opening 460, and does not remove all of the etch stop material adjacent to the spacer portion 435 of the TEOS layer 420. Thus, the remaining etch stop material adjacent to the spacer portion 435 of the TEOS layer 420 serves as additional spacer material to insulate the polysilicon layer 415 from a conductive contact that will subsequently be added to the contact opening 460.

The etchant utilized to remove silicon nitride from the contact opening 460 has a low selectivity for etching the silicon nitride material compared to the underlying TEOS layer 420. The use of an etchant with a low selectivity for silicon nitride relative to TEOS does not significantly destroy the TEOS layer spacer portion 435. The low selectivity etch yields a TEOS layer spacer portion 435 that retains a rectangular or "boxy" profile. FIG. 4(K) illustrates that only a small portion 475 (illustrated in ghost lines) of the TEOS layer spacer portion 435 is removed during the etch. Of primary significance, the spacer portion 435 of the TEOS layer 420 retains its substantially rectangular profile.

It is to be appreciated that the described etch stop layer etch conditions (i.e., low selectivity, low bombardment/high neutral flux) are exemplary of etch conditions that result in the retention of a boxy spacer. The invention relates to these process conditions as well as others that result in the retention of a boxy spacer. Thus, the etch-stop etch conditions should be regarded in an illustrative rather than restrictive sense.

The silicon nitride etch stop layer etch is followed by a sputter etch to clean the contact opening 460. In a currently preferred embodiment, the sputter etch is carried out in an atmosphere of argon, a 8 mtorr pressure, with a 1000 volt bias. In a currently preferred embodiment, the sputter etch is carried out in a commercially available system such as the Applied Materials Endura 5500 systems. Alternatively, any system having a sputter etch mode may be used to practice the invention. As will be appreciated by a person of ordinary skill in the art, the parameters can be varied considerably while still achieving the objects of the invention. In a currently preferred embodiment, the etch is designed to etch approximately 200 Å per minute as measured on thermal oxide. Because of the retention of a substantially rectangular or "boxy" spacer portion 435, the sputter etch does not significantly erode the spacer portion 435 of the TEOS layer 420.

At this point, the invention contemplates that the minimum encapsulating dielectric layer, i.e., TEOS, thickness will be approximately 400 Å and that this minimum thickness will be at the corner most effected by the etch-stop layer etch and the sputter etch. In FIG. 4(K) that minimum thickness is the diagonal denoted d.

Figure 4L:
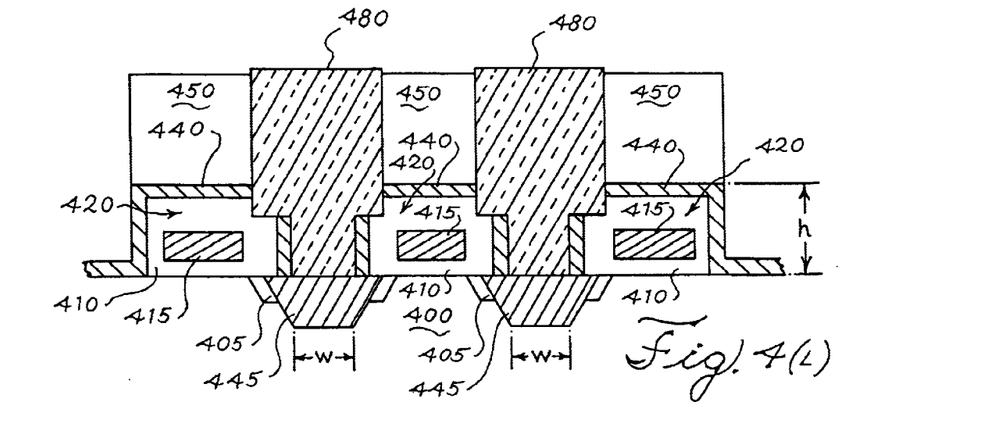
FIG. 4(L) illustrates a cross-sectional planar side view of a series of gates encapsulated with insulating material, an etch stop layer overlying the insulating material, a distinct planarized insulating blanket layer overlying the etch stop layer, and a conductive contact in a contact region extending to a diffusion region in the semiconductor substrate.

FIG. 4(L) presents a cross-sectional planar side view of the structure of the invention wherein conductive contacts 480 have been deposited in the contact openings 460.

The process described above yields a structure wherein first and second conductive layers (e.g., polysilicon layers) are separated by a contact opening with an area defined in the semiconductor substrate. An insulating layer is adjacent to and encapsulates the first and second conductive layers. The invention contemplates that the insulating layer has spacer portions between the conductive layers and the contact opening. The invention contemplates that high quality contacts can be achieved wherein the spacer portions have a minimum insulative material thickness of 400 Å. In the preferred embodiment, the spacer portions of the insulating material further have substantially rectangular profiles. The invention also contemplates that a portion of the etch stop layer material may remain adjacent to the spacer portion of the insulating layer following an anisotropic etch of the etch stop material with a low selectivity etch for the etch stop material relative to the insulating layer material. The result is a contact opening with spacer sidewalls comprised, at least potentially, of a portion of etch stop layer material.

The invention contemplates that effective contact openings may have base widths as small as 0.2 μm (and as small as 0.5 μm when measured from the top of the optional planarized layer), and base areas as small as 0.1 $\mu m_2$. Thus, the invention contemplates aspect ratios for effective contact openings of 1.0–2.4, wherein an aspect ratio is defined as the ratio of the height of a contact opening measured to the top of the horizontal portion of the etch stop layer 440 to the base width of the contact opening between the spacers. FIG. 4(L) illustrates a height, h, and a width, w, from which an aspect ratio may be calculated for a contact region.

In the preceding detailed description, the invention is described with reference to specific exemplary embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A structure, comprising:
   (a) a conductive layer disposed over a substrate;
   (b) a first insulating layer on the conductive layer:
   (c) a contact region in said first insulating layer;
   (d) at least one insulating spacer in the contact region adjacent to the first insulating layer; and
   (e) an etch stop material over said first insulating layer and adjacent to the insulating spacer, the etch stop material being a different material from the insulating spacer,
   wherein a side of the insulating spacer has an angle relative to the substrate surface that is either a right angle or an acute angle of more than 85°.

2. The semiconductor apparatus of claim 1 wherein said etch stop material comprises silicon nitride.

3. The semiconductor apparatus of claim 1 wherein said etch stop material comprises silicon dioxide.

4. The structure of claim 1, wherein the insulating spacer has a surface portion in the contact region without overlying etch stop material.

5. The structure of claim 4, wherein the insulating spacer surface portion without overlying etch stop material comprises an insulating spacer surface portion most distant from said substrate.

6. The structure of claim 1, further comprising a second insulating layer on the etch stop layer and over the conductive layer.

7. The structure of claim 6, further comprising a second conductive material in the contact region.

8. A structure, comprising:
   (a) a first electrically conductive material formed in and/or on a surface of a substrate;
   (b) a contact opening in a region adjacent to a second electrically conductive material formed on the substrate;
   (c) an electrically insulative spacer in the contact opening adjacent to the second electrically conductive material;
   (d) an etch stop material over the electrically insulative spacer and the first and second electrically conductive materials, the etch stop material being a different material from the insulative spacer;
   (e) a blanket layer over the etch stop material; and
   (f) an opening through a first part of the etch stop material to the first electrically conductive material,
   wherein a side of the electrically insulative spacer has an angle relative to the substrate surface that is either a right angle or an acute angle of more than 85°.

9. The structure of claim 8, wherein the electrically insulative spacer has a surface portion without overlying etch stop material.

10. The structure of claim 9, wherein the electrically insulative spacer surface portion without overlying etch stop material comprises a surface portion most distant from the substrate.

11. The structure of claim 8, further comprising a second insulating layer on the etch stop layer and over the conductive layer.

12. The structure of claim 11, further comprising a second conductive material in the contact region.

* * * * *